US012658275B2

(12) United States Patent
Litt et al.

(10) Patent No.: US 12,658,275 B2
(45) Date of Patent: Jun. 16, 2026

(54) DETECTING ERRORS WITHIN DATA PATH CIRCUITRY OF A MEMORY DEVICE

(71) Applicants: Advanced Micro Devices, Inc., Santa Clara, CA (US); ATI Technologies ULC, Thornhill (CA)

(72) Inventors: Michael Litt, Ontario (CA); Yubin Yao, Santa Clara, CA (US); Vilas Sridharan, Boxborough, MA (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 46 days.

(21) Appl. No.: 18/766,219

(22) Filed: Jul. 8, 2024

(65) Prior Publication Data

US 2025/0201329 A1     Jun. 19, 2025

Related U.S. Application Data

(60) Provisional application No. 63/611,083, filed on Dec. 15, 2023.

(51) Int. Cl.
*G11C 29/42* (2006.01)
*G06F 11/10* (2006.01)

(52) U.S. Cl.
CPC .......... *G11C 29/42* (2013.01); *G06F 11/1008* (2013.01)

(58) Field of Classification Search
CPC ... G11C 29/42; G06F 11/1004; G06F 11/1008
See application file for complete search history.

(56) References Cited

U.S. PATENT DOCUMENTS

| | | | | |
|---|---|---|---|---|
| 2004/0177314 A1* | 9/2004 | Kleihorst | ......... | G01R 31/31921 |
| | | | | 714/801 |
| 2011/0154157 A1 | 6/2011 | Naeimi | | |
| 2012/0284590 A1* | 11/2012 | Ku | ...... | G06F 11/0772 |
| | | | | 714/799 |
| 2013/0117641 A1* | 5/2013 | Bains | ......... | G06F 11/1016 |
| | | | | 714/802 |
| 2020/0348999 A1 | 11/2020 | Mirichigni et al. | | |
| 2022/0179736 A1 | 6/2022 | Sforzin et al. | | |
| 2022/0382629 A1 | 12/2022 | Graumann | | |
| 2023/0119555 A1 | 4/2023 | Kim et al. | | |
| 2023/0297466 A1* | 9/2023 | Bhatia | ......... | G06F 11/1068 |
| | | | | 714/764 |
| 2024/0061741 A1* | 2/2024 | Agarwal | ......... | G11C 29/10 |

OTHER PUBLICATIONS

International Search Report and Written Opinion for PCT/US2024/037436 dated Oct. 29, 2024.

* cited by examiner

*Primary Examiner* — Steve N Nguyen
(74) *Attorney, Agent, or Firm* — Patterson + Sheridan, LLP

(57) ABSTRACT

A memory device includes core circuitry including memory cells, and write data path circuitry coupled to the core circuitry. The write data path circuitry determines a second parity bit from a second signal and a poison bit. The second signal and the poison bit are determined by processing a first data signal. Further, the write data path circuitry detects a first error within the second signal based on a comparison between a first parity bit and the second parity bit, and outputs a first error signal comprising the first error.

20 Claims, 9 Drawing Sheets

700

710

DETERMINE A FIRST PARITY BIT BASED ON A FIRST SIGNAL, A POISON BIT, AND A SEVERITY BIT

720

DETERMINE A SECOND PARITY BIT FROM A SECOND SIGNAL

730

DETECT A FIRST ERROR WITHIN THE SECOND SIGNAL BASED ON THE FIRST PARITY BIT AND THE SECOND PARITY BIT

740

OUTPUT A FIRST ERROR SIGNAL INCLUDING THE FIRST ERROR

DETECTING ERRORS WITHIN DATA PATH CIRCUITRY OF A MEMORY DEVICE

CROSS REFERENCE TO RELATED APPLICATION

This application claims priority to the U.S. Provisional Patent Application No. 63/611,083, filed on Dec. 15, 2023 of which is incorporated herein by reference in its entirety.

TECHNICAL FIELD

Examples of the present disclosure generally relate to error detection within a memory device, and more specifically to detecting errors of a signal processed within read and write data path circuities of a memory device.

BACKGROUND

Memory systems employ various data integrity schemes to mitigate errors in signals transmitted to and from memory devices and/or to protect data of the signal as the data is transmitted to and from the memory devices. The data integrity schemes include using error correcting codes (ECCs), and/or cyclic redundancy check (CRC) processes. An ECC scheme may be an inline ECC scheme that uses memory within the corresponding memory device to store the ECC codes. The ECC codes are used when read and write commands are performed to detect errors within the data of the corresponding memory transactions. A CRC process is used to detect changes in bits within a data signal. The CRC process detects changes at different points along a data path.

SUMMARY

In one example, a memory device includes core circuitry including memory cells, and write data path circuitry coupled to the core circuitry. The write data path circuitry determines a first parity bit based on a first signal, and determines a second parity bit from a second signal and a poison bit. The second signal and the poison bit are determined by processing the first data signal. Further, the write data path circuitry detects a first error within the second signal based on a comparison between the first parity bit and the second parity bit, and outputs a first error signal comprising the first error.

In one example, a memory device includes core circuitry including memory cells, and read data path circuitry coupled to the core circuitry. The read data path circuitry determines a first parity bit based on a first signal, a poison bit, and a severity bit. The poison bit and the severity bit is determined from the first signal. Further, the read data path circuitry determines a second parity bit from a second signal. The second signal is generated by processing the first signal. The read data path circuitry further detects a first error within the second signal based on a comparison between the first parity bit and the second parity bit; and

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

A memory system includes a memory device coupled with a host device. As signals are transmitted between the host device and the memory device, data integrity processes are used to mitigate errors within the signals. For example, a memory system may employ error correcting code (ECC) processes and cyclic redundancy check (CRC) processes as data integrity processes. Further in some examples, data mask scheme and read-modify-write operations are used for data integrity.

In an ECC process, to ensure that there is data integrity of a signal from a host device to the memory device, the ECC codes are generated and communicated from the host device. The ECC codes are stored in the memory device. Accordingly, using such an ECC process, memory resources are used to store the ECC codes, decreasing the amount of available data that is available to store data or increasing the cost of the memory device as the size of the memory device is increased to support storage of the ECC codes.

In a CRC process, errors are detected within the data signals at specific points along the data path circuitry. However, before or after the CRC process is completed, values of bits within the data signal may change. The change in values of the bits may not be detected by the CRC process. Accordingly, errors may exist within the signals output to the host device or the memory device that are not detected by the CRC process. Further, the use of CRC bits increases the number of memory cells within the memory device, increasing the cost of the memory device.

A memory device as described in the following uses data path CRC circuitry to detect and mitigate errors within the corresponding data path circuitries. In one example, the data path CRC circuitry includes CRC (DPCRC) generation circuitry and DPCRC check circuitry in the write and read data path circuitries that detect and mitigate errors within the corresponding data path circuitries. The data path CRC circuitry use one or more parity bits to detect and/or mitigate errors within a corresponding signal as the signal is communicated within the corresponding data path. In one example, the data path CRC circuitry generates the one or more parity bits. The use of parity bits maintains data integrity within the write data path circuitries and the read data path circuitries without any significant increase in the size and cost of the memory device and/or the complexity and cost of the memory controller of the host device. The use of the data path CRC circuitry allows for data integrity to be used by a larger number of memory controllers, and specifically with memory controllers that do not include other types of data integrity processes. Further, the proposed method does not increase the storage related costs as additional memory cells are not used to store ECC bits or code generated by a host device.

Figure 1:
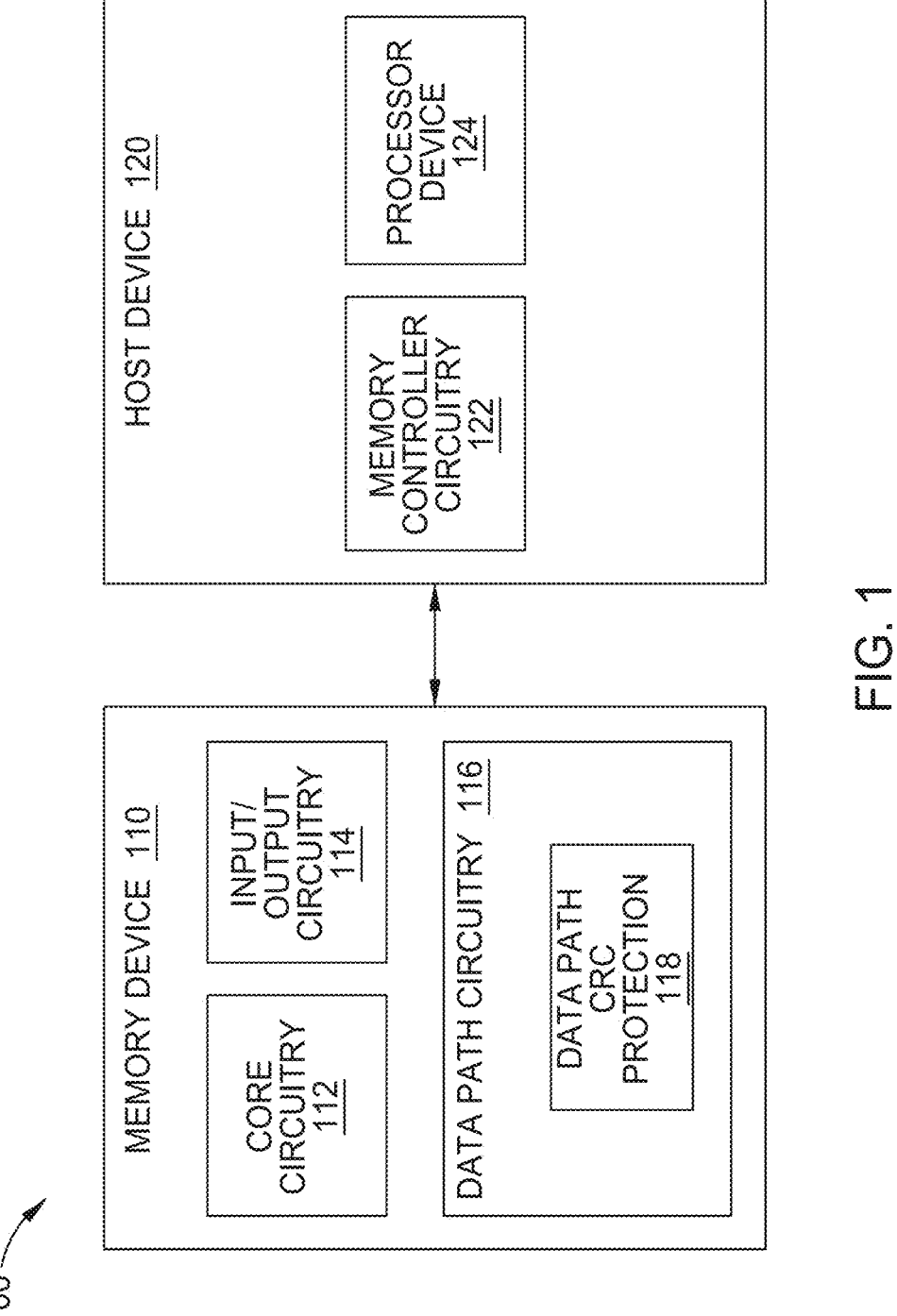
FIG. 1 is a block diagram of a memory system.

FIG. 1 illustrates a memory system 100. The memory system 100 includes the memory device 110 and the host device 120. The memory system 100 is an integrated circuit (IC) device. The memory system 100 includes one or more IC chips. For example, the memory device 110 is part of a first one or more IC chips and the host device 120 is part of a second one or more IC chips.

The host device 120 includes memory controller circuitry 122 and a processing device 124. The processing device 124 is a central processing unit (CPU) or a graphics processing unit (GPU), among others.

The memory device 110 is dynamic random access memory (DRAM). In one example, the memory device is a double data rate (DDR) memory device. In one example, the memory device is a graphics DDR (GDDR) memory device. In other examples, the memory device 110 is a high bandwidth memory (HBM) device. A HBM device includes vertically stacked memory device chips.

The memory device 110 includes core circuitry 112, input/output circuitry 114, and data path circuitry 116. The core circuitry 112 includes memory cells (e.g., bitcells), bit lines, word lines, sense amplifier circuitry, row decoder circuitry, and/or column decoder circuitry, among others.

The input/output circuitry 114 includes receiver circuitry that receives signals from the memory controller circuitry 122, and transmitter circuitry that transmits signals to the memory controller circuitry 122. The input/output circuitry 114 may be physical layer (PHY) circuitry. In one or more examples, the input/output circuitry 114 includes one or more buffers and/or other circuit elements to facilitate the receipt and transmission of signal.

The data path circuitry 116 includes write data path circuitry and read data path circuitry. The data path circuitry 116 is coupled between the core circuitry 112 and the input/output circuitry 114. The data path circuitry 116 communicates signals from the core circuitry 112 to the input/output circuitry 114, and performs one or more of decoding processes, encoding processes, ECC process, and CRC process. In one or more examples, as described in greater detail in the following, the data path circuitry 116 data path CRC circuitry 118. The data path CRC circuitry 118 detects and mitigates errors within the data path circuitry 116. In one or more examples, the data path CRC circuitry 118 includes DPCRC generator circuitry and/or and DPCRC check circuitry. In one example, a first data path CRC circuitry 118 is included within the write data path circuitry of the data path circuitry 116 and/or a second data path CRC circuitry 118 is included within the read data path circuitry of the data path circuitry 116. In one example, the data path CRC circuitry 118 is coupled to the core circuitry 112. For example, the data path CRC circuitry 118 is coupled to the core circuitry 112 via the data path circuitry 116 to detect errors within the data path circuitry 116.

In one or more examples, data integrity protection is lacking in at least a portion the data path circuitry of the memory device 110. In one example, an on die ECC scheme of the memory device 110 protects the data within the core circuitry 112 from erroneously bit flips and the CRC write and read check schemes of the memory device 110 protect data as the corresponding signal is communicated to and from the core circuitry 112 and/or host device 120. However, bit flips, bugs, or another stimulus that causes a change to a value within a signal may occur between the on die ECC circuitry and CRC write/read check circuitry, which results in read or write errors that are not detected or mitigated. In one or more examples, a bit flip that occurs in the signal between the CRC write/read check circuitry of the data path circuitry and the on die ECC circuitry data path circuitry may be incorporated within the generated ECC codes (e.g., checksum). In an example where a signal received by a host device has an error, an ECC code generated by the host device from the signal will also have the error. In the above examples, the data path CRC circuitry 118 detects and mitigates the above example errors within the data path circuitry 116.

FIG. 2 illustrates an example block diagram of write data path circuitry 200 of the memory system 100. The write data path circuitry 200 is part of the data path circuitry 116 of FIG. 1. The write data path circuitry 200 is included within the memory device 110. The write data path circuitry 200 may be included within a common IC device and/or die as the core circuitry 112 and/or the input/output circuitry 114. The write data path circuitry 200 communicates data within a signal received by the input/output circuitry 114 from the host device 120 (e.g., the memory controller circuitry 122 of the host device 120) to the core circuitry 112 based on a write command provided by host device 120. The write command includes an address within the core circuitry 112 to write the data.

The write data path circuitry 200 includes decoder circuitries 210-216, CRC write check circuitry 218, scrambler circuitry 220, on die ECC circuitry 222, DPCRC generator circuitry 224, and DPCRC check circuitry 226. The DPCRC generator circuitry 224 and DPCRC check circuitry 226 form data path CRC circuitry (e.g., the data path CRC circuitry 118).

In one example, an input of the decoder circuitry 210 is coupled to an output of the input/output circuitry 114 and an output of the decoder circuitry 210 is coupled to an input of the CRC write check circuitry 218. One or more outputs of the CRC write check circuitry 218 is coupled to inputs of the decoder circuitries 212, 214, and 216. An output of the CRC write check circuitry 218 is coupled to the input/output circuitry 114.

An output or outputs of the DPCRC generator circuitry 224 is coupled to the DPCRC check circuitry 226. The outputs of the decoder circuitries 212 and 214 are coupled to an input scrambler circuitry 220. An output of the scrambler circuitry 220 is coupled to an input of the DPCRC check circuitry 226, the on die ECC circuitry 222, and the core circuitry 112. An output of the decoder circuitry 216 is coupled to an input of the on die ECC circuitry 222 and an input of DPCRC check circuitry 226. An output of the on die ECC circuitry 222 is coupled to an input of the core circuitry 112. An output or outputs of the DPCRC check circuitry is coupled to the input/output circuitry 114.

The host device 120 outputs the signal 260 to the input/output circuitry 114. The signal 260 is a pulse-amplitude modulation 3 (PAM-3) signal. In other examples, the signal 260 may have more or less than three levels, or a different communication protocol than pulse-amplitude modulation. In one example, the signal 260 has 176 symbols. In other examples, the signal 260 has more or less than 176 symbols.

The input/output circuitry 114 outputs the signal 231 to the decoder circuitry 210 and to the input of the DPCRC generator circuitry 224. The signal 231 corresponds to the signal 260. The signal 231 includes one or more data symbols and one or more CRC symbols. In one example, the signal 231 includes 164 data symbols and 12 CRC symbols. The signal 233 including the CRC symbols is received by the decoder circuitry 210. The decoder circuitry 210 decodes the CRC symbols of the signal 233 to generate the signal 234. In one example, the signal 234 has 18 bits. The signal 234 is received by the CRC write check circuitry 218 as CRC data. The CRC write check circuitry 218 further receives the signal 232.

The signal 234 is used to perform a CRC check on the signal 232. For example, the data symbols of the signal 232 are used to generate CRC data by the CRC write check circuitry 218. The CRC data is compared to the CRC data of the signal 234. If the data matches, no errors are reported in the signal 231. If the data does not match, errors are reported within the signal 231.

The CRC write check circuitry 218 outputs the error signal 250. The error signal 250 is combined with the error signal 249 output by the DPCRC check circuitry 226, and output as the error signal 251 to the input/output circuitry 114, which is output to the host device 120. A value of the error signal 250 is indicative as to whether an error was detected by the CRC write check circuitry 218 or the DPCRC check circuitry 226. In one example, the value of the error signal 250 indicates the type of error. In one or more examples, a value of zero indicates a CRC write check error and a value of one indicates no error. In other examples, other values may be used to indicate other types of errors. In one example, if the CRC check fails, the error is reported back via an error output pin to the host device 120. In one example, the errors may be write CRC (WR-CRC) errors (indicated as a value of 0), command address parity errors (indicated as a value of −1), and no error (indicated as a value of 1). The previous example is for a PAM-3 signal protocol. In other examples, greater than or less than three values may be used to report errors or no errors. Further, the values may be used in different ways to report errors or no errors.

In one example, the error signal 251 is a PAM-3 signal. In other examples, other communication protocols may be used to communicate the error signal 251.

The DPCRC generator circuitry 224 receives the signal 232. In one example, the DPCRC generator circuitry 224 receives the signal 232 based on the signal 232 being confirmed to be free from errors. The DPCRC generator circuitry 224 generates an error check signal 236 from the bits of the signal 232. The error check signal 236 includes a parity bit or bits determined from the bits of the signal 232. In another example, the error check signal 236 includes one or more CRC codes determined from the bits of the signal 232.

The DPCRC generator circuitry 224 generates the error check signal 236 from the symbols of the signal 232. In one example, the error check signal 236 is one or more parity bits generated based on a number of ones or zeros within the signal 232. In one example, the parity bit of the error check signal 236 may be a value of zero or one (or another value). In one example, if the number of ones (or zeros) within the signal 232 is odd, the parity bit value is zero, and if the total number of ones (or zeros) in the signal 232 is even, the parity bit value is one. In other examples, the parity bit may be determined using other methods.

The signal 232 is further received by the decoder circuitries 212, 214, and 216. The decoder circuitry 212 receives first symbols of the signal 232, the decoder circuitry 214 receives second symbols of the signal 232, and the decoder circuitry 216 receives a third symbol (or symbols) of the signal 232. In an example where the signal 232 has 164 symbols, the decoder circuitry 212 receives 161 symbols, the decoder circuitry 214 receives two symbols, and the decoder circuitry 216 receives one symbol. The symbol received in the signal 239 by the decoder circuitry 216 corresponds to a poison bit and/or a severity bit.

The decoder circuitry 212 decodes the symbols of the signal 237 to generate the data signal 240. The decoder circuitry 214 decodes the symbols of the signal 238 to generate the data signal 241. Further, the decoder circuitry 216 decodes the symbol(s) of the signal 239 to generate the poison bit 244 and the severity bit of the signal 246.

The scrambler circuitry 220 receives the signal 242, which is a combination of the signals 240 and 241, and generates the signal 243. In one example, the signal 240 has 253 bits, the signal 241 has 3 bits, and the signal 242 has 256 bits. Further, the signal 243 has 256 bits. The scrambler circuitry 220 inverts or randomizes one or more values within the signal 242 to generate the signal 243.

The on die ECC circuitry 222 receives the signal 243 and the signal 244 including the poison bit and/or severity bit and generates an ECC code based on the signal 243 and 244. The ECC code of the signal 245 is output to and stored in the core circuitry 112. In one or more examples, the on-die ECC circuitry 222 generates an ECC code (e.g., a checksum) 245 based on the signal 243 and stores the ECC code of the signal 245 in the core circuitry 112

The DPCRC check circuitry 226 receives the signal 243, the signal 244, and the signal 246. The signal 246 is the severity bit. In one example for a write command, the signal 246 has a value zero.

The DPCRC check circuitry 226 generates a parity bit or bits from the signal 243, the signal 244, and the signal 246. In one example, an error signal that corresponds to the error check signal 236 is generated by the DPCRC check circuitry 226. In an example where the error check signal 236 is a parity bit or bits, the error signal generated by the DPCRC check circuitry 226 is a parity bit or bits. The parity bit (or bits) is generated as is described above with regard to the DPCRC generator circuitry 224 based on the signals 243, 244, and 246. The parity bit may be a value of zero or one, and is based on the number of zeros or ones within the signals 243, 244, and 246. In an example where the error check signal 236 is a CRC code, the error signal generated by the DPCRC check circuitry 226 is a CRC code. The CRC codes are generated as described above.

If the error signal (e.g., parity bit(s) or CRC code(s)) determined by the DPCRC check circuitry 226 and the error check signal 236 (e.g., parity bit(s) or CRC code(s)) match (e.g., have the same value), no errors are detected and reported via the error signal 249. For example, a value of zero is reported to the host device 120 indicating that no errors were detected. If an error is detected, a value of one is reported to the host. The error is reported as a DPCRC error. In other examples, the values assigned to errors and no errors may be reversed, or other values may be used to report different types of errors.

The error detection method described herein determines if a bit is flipped in the signal between the DPCRC generator circuitry 224 and the DPCRC check circuitry 226. If a bit is flipped, the parity bits determined by the DPCRC generator circuitry 224 and the DPCRC check circuitry 226 are different and an error is reported. In one example based on an error being detected, the transmission of the data signal 260 is retried. For example, the data signal 260 is retransmitted from the host device 120 to the core circuitry 112 via the write data path circuitry 200 and the input/output circuitry 114.

In one example, a single parity bit is generated by the DPCRC check circuitry 226 and the DPCRC generator circuitry 224. In other examples, more than one parity bit may be used. In one example, the number of parity bits may be programmable.

Figure 2A:
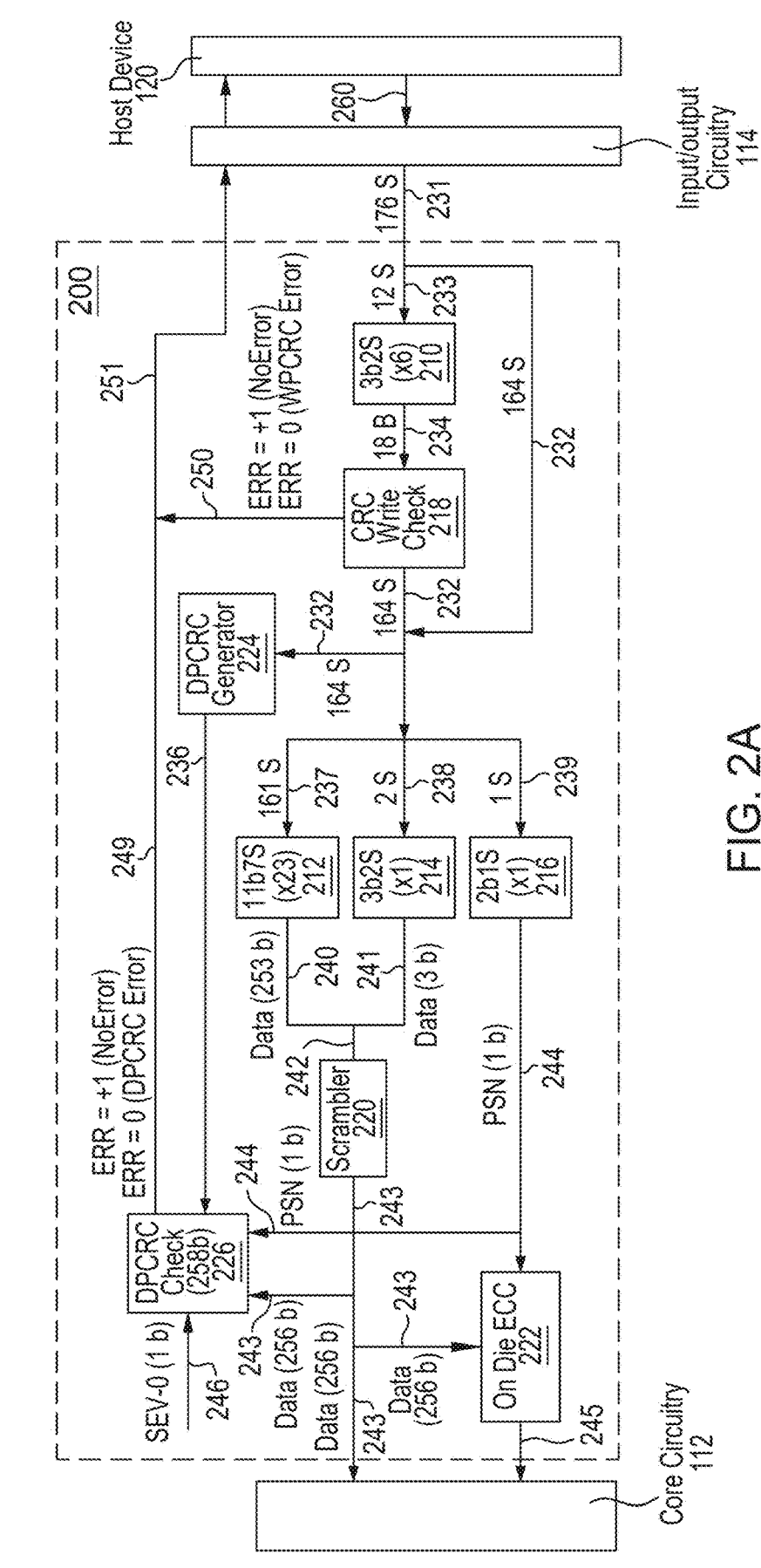
FIG. 2A is a block diagram of write data path circuitry of a memory system.
Figure 2B:
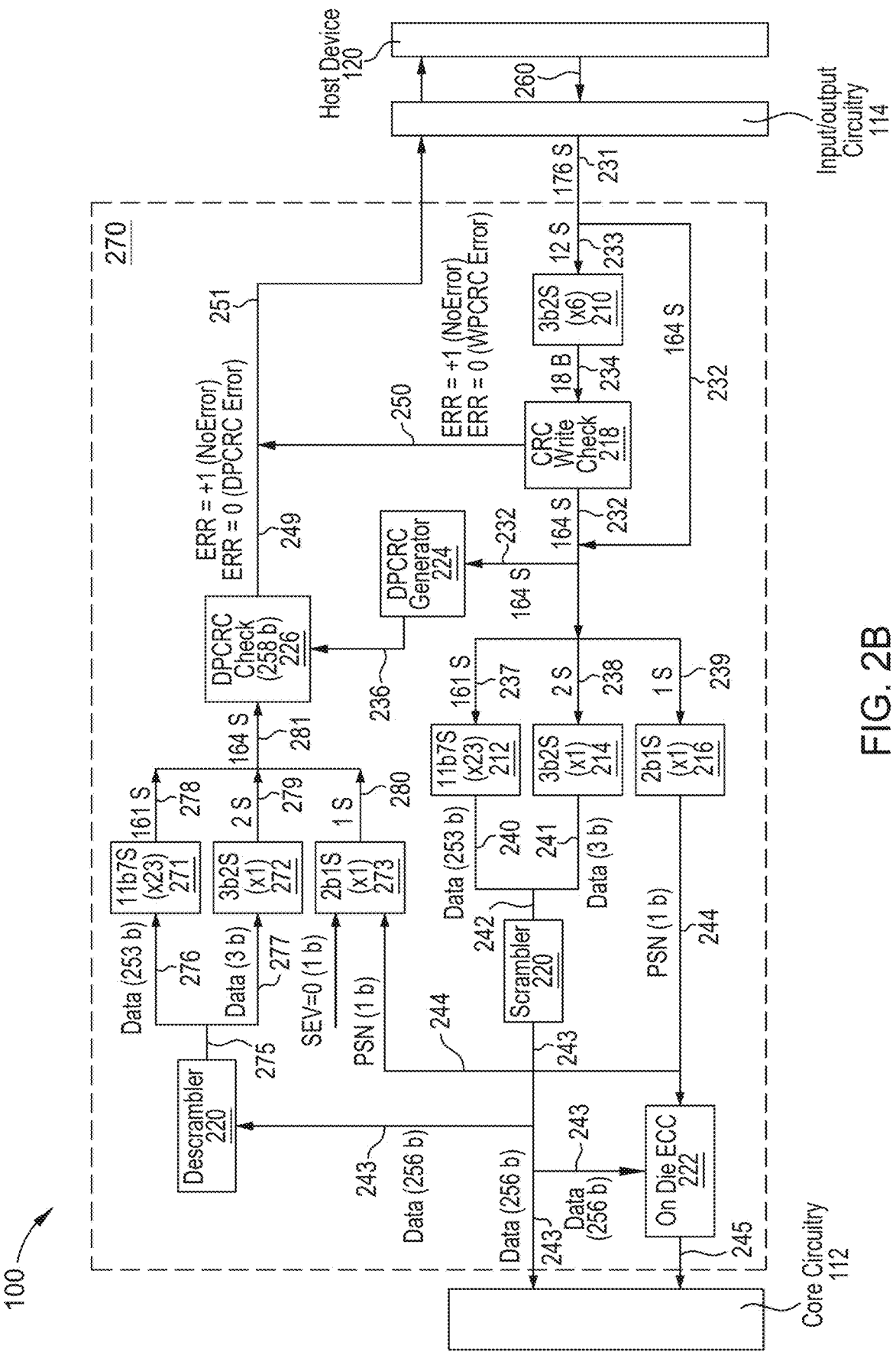
FIG. 2B is a block diagram of write data path circuitry of a memory system.

FIG. 2B illustrates an example block diagram of write data path circuitry 270 of the memory system 100. The write data path circuitry 270 is part of the data path circuitry 116 of FIG. 1. The write data path circuitry 270 is included within the memory device 110. The write data path circuitry 270 may be included within a common IC device and/or die as the core circuitry 112 and/or the input/output circuitry 114. The write data path circuitry 270 communicates data within a signal received by the input/output circuitry 114 from the host device 120 (e.g., the memory controller circuitry 122 of the host device 120) to the core circuitry 112 based on a write command provided by host device 120.

The write data path circuitry 270 is configured similar to that of the write data path circuitry 200 of FIG. 2A. For example, the write data path circuitry 270 includes decoder circuitries 210-216, CRC write check circuitry 218, scrambler circuitry 220, on die ECC circuitry 222, DPCRC generator circuitry 224, and DPCRC check circuitry 226. As compared to the write data path circuitry 200, the write data path circuitry 270 further includes encoder circuitries 271-273, and descrambler circuitry 274. Further, in the write data path circuitry 270, an input or inputs of the DPCRC check circuitry 226 is coupled to the outputs of the encoder circuitries 271-273. In one example, the DPCRC generator circuitry 224 and DPCRC check circuitry 226 form data path CRC circuitry (e.g., the data path CRC circuitry 118 of FIG. 1).

An input of the descrambler circuitry 274 is coupled to the output of the scrambler circuitry 220 circuit, and receives the signal 243 from the scrambler circuitry 220. The descrambler circuitry 274 descrambles (e.g., reverses the functions performed by the descrambler circuitry 274) the signal 243 to generate the signal 275. The signal 275 includes 256 bits.

Inputs of the encoder circuitries 271 and 272 are coupled to an output of the descrambler circuitry 274. The encoder circuitry 271 receives signal 276 including a first portion of the bits of the signal 275 and the encoder circuitry 272 receives signal 277 including a second portion of the bits of the signal 275. The number of bits within the signal 276 is greater than the number of bits in the signal 277. In one example, the signal 276 includes 253 bits and the signal 277 includes 3 bits. In other examples, the signals 276 and 277 may have other number of bits. The encoder circuitry 271 encodes the bits of the signal 276 to generate the symbols of the signal 278. The signal 278 may include 161 symbols. The encoder circuitry 272 encodes the bits of the signal 277 to generate the symbols of the signal 279. The signal 279 may include 2 symbols.

An input of the encoder circuitry 273 is coupled to an output of the decoder circuitry 216 and receives the signal 244. The encoder circuitry 273 further receives the severity bit. In one example for a write command, the severity bit has a value of 0. The encoder circuitry 273 encodes the signal 244 and the severity bit into the symbol of the signal 280. In one example, the signal 280 includes one or more symbols.

The signals 278, 279, and 280 are combined into the signal 281, which is received by the DPCRC check circuitry 226. In one example, the DPCRC check circuitry 226 receives each of the 278, 279, and 280 and internally combines the signals. The DPCRC check circuitry 226 functions as described above to generate an error signal that is compared to the error check signal 236 generated by the DPCRC generator circuitry 224 to determine if errors exist in the signal 243.

The error signals 249 and 250 are combined as described above and output as the error signal 251 as described above.

Figure 3:
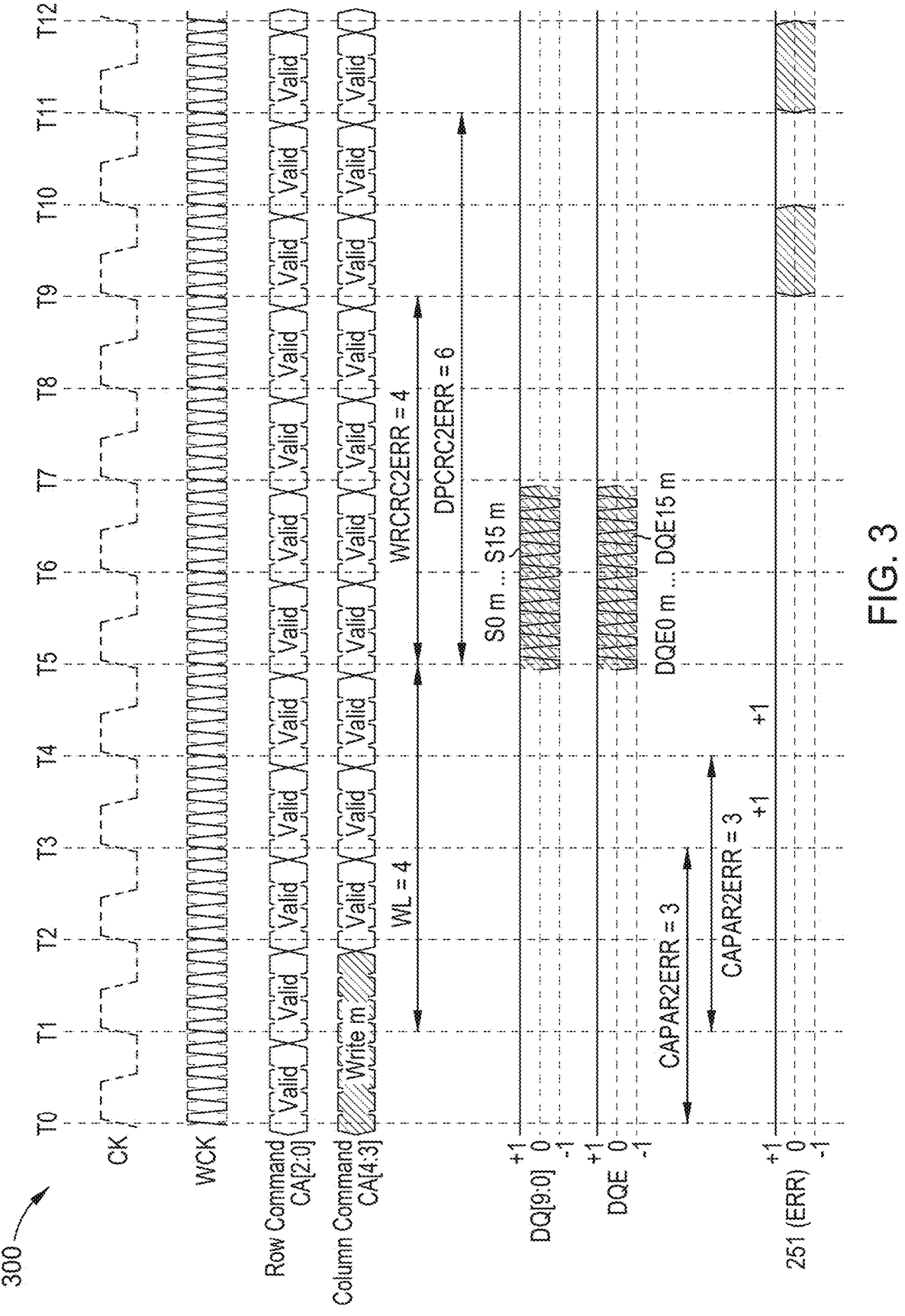
FIG. 3 is a timing diagram of a memory command within write data path circuitry of a memory system.

FIG. 3 illustrates a timing diagram 300. The timing diagram 300 is for the write data path circuitry 200 of FIG. 2A or the write data path circuitry 270 of FIG. 2B processing a write command, e.g. write command m. The timing diagram 300 includes a clock signal CK, write clock signal WCK, row command CA, column command CA, data signal DQ, a data enable signal DQE, and an error signal 251. Further, the timing diagram indicates write latency (WL) timing, WRCRC2ERR, DPCRC2ERR, and CAPAR2ERR. The write latency (WL) indicates when a difference in time (e.g., a number of cycles) from the data is available to be written from when the write command is initiated. In the example of FIG. 3, the WL is 4 cycles of the clock signal CK.

WRCRC2ERR is the amount of time from when the data is available (e.g., the data signal 260 of FIG. 2A is received) to be written and the host device (e.g., the host device 120 of FIG. 1) is notified that for a corresponding transaction if there was an error or not in the transmitted data. The WRCRC2ERR timing corresponds the error check completed by the CRC check circuitry (e.g., the CRC write check circuitry 218 of FIG. 2A) of the write data path circuitry 200. In the example of FIG. 3, the WRCRCERR timing is four cycles of the clock signal CK. In one example for the write command m, an indication as to whether or not an error is detected by CRC write check circuitry 218 is output at time T9. The value of the error signal 251 indicates whether or not an error was detected by the CRC write check circuitry 218.

DCRC2ERR is the amount of time from when the data is available (e.g., the data signal 260 of FIG. 2A is received) and an error is detected or not detected by the DPCRC check circuitry (e.g., the DPCRC check circuitry 226 of FIG. 2A). At time T11, the error signal 251 includes an indication as to whether or not the DPCRC check circuitry 226 detected an error.

In one example, the timing DPCRC2ERR is six cycles of the clock signal CK. Accordingly, the latency associated with DPCRC2ERR is longer than the latency associated with WRCRC2ERR. Accordingly, while the error signal 251 is shared between the CRC write check circuitry 218 and the DPCRC check circuitry 226, the host device 120 is able to determine the origination of the error within the error signal 251.

In one or more examples, as the error signals are output via a common output (e.g., common line and/or pin), the timing is used to determine the type of error. For example at time T9, errors related to the CRC check circuitry (e.g., WRCRC2ERR) are reported. With reference to FIGS. 1 and 2, the host device 120 receives the error signal 251, and based on the timing, determines the type of error. At time T9, the host device 120 determines that the error signal 251 is reported by the CRC write check circuitry 218 and corresponds to an error at the CRC write check circuitry 218. At time T11, the host device 120 determines that the error signal 251 corresponds to an error at the DPCRC check circuitry 226.

Figure 4:
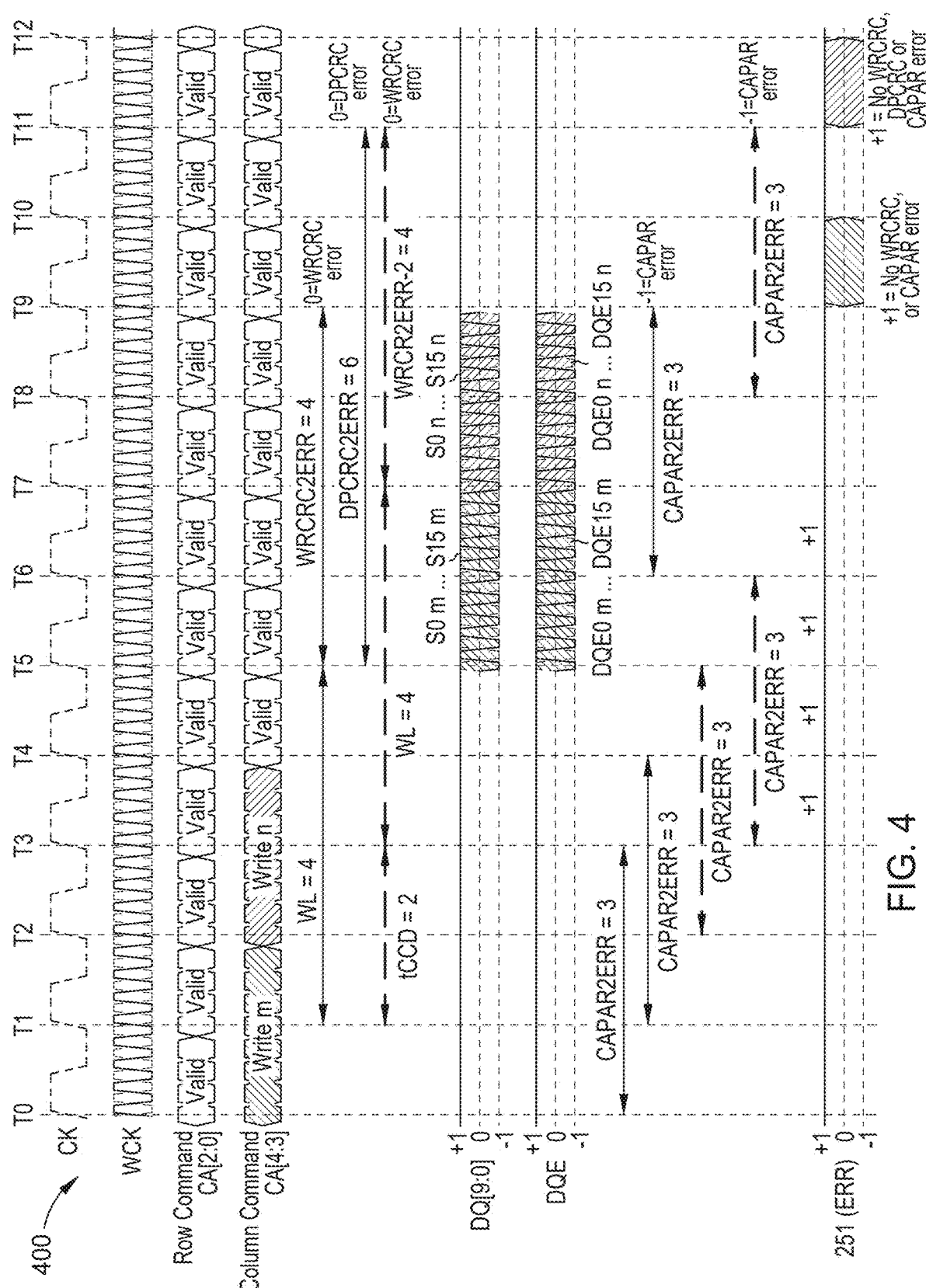
FIG. 4 is a timing diagram of back to back memory commands within write data path circuitry of a memory system.

FIG. 4 illustrates a timing diagram 400 for write data path circuitry (e.g., the write data path circuitry 200 of FIG. 2A). As compared to the timing diagram 300 of FIG. 3 that includes a single write commend, the timing diagram 400 is for two write commands, e.g. write command m and write command n. The write commands m and n occur sequentially to each other, such that they are back to back to each other. The timing diagram 400 includes a clock signal CK, write clock signal WCK, row command CA, column command CA, data signal DQ, a data enable signal DQE, and an error signal 251. Further, the timing diagram 400 indicates write latency (WL) timing for each write command, WRCRC2ERR for each write command, DPCRC2ERR for the first write command (e.g., the write command m), and CAPAR2ERR associated with parity checking for the write commands.

As the write commands m and n are issued back to back, with no other commands issued between, the reporting time associated with an error from the DPCRC check circuitry 226 (e.g., DPCRC2ERR) of the first write command (e.g., the write command m), and the reporting time associated with an error from CRC write check circuitry 218 (e.g., WRCRC2ERR-2) of the second write command (e.g., the write command n) both occur at time T11. Accordingly, the host device (e.g., the host device 120) is unable to determine where the error originated, e.g., from the CRC write check circuitry 218 or the DPCRC check circuitry 226. Further, at each cycle of the clock signal CK, a parity check for each command is performed. The timing of the output of parity check is indicated by CAPAR2ERR. As can be seen in the timing diagram 400, an output of a parity check occurs at time T11. Accordingly, if an error is reported by a parity check at time T11 to the host device 120 via the error signal 251, the host device 120 is unable to determine if the error was based on a parity check error, output by the CRC write check circuitry 218, and the DPCRC check circuitry 226.

The host device 120 is provided an indication that an error is reported at time T11 via the error signal 251. Based on the indication of the error at time T11, the host device 120 retries the memory commands m and n as the host device 120 is unable to determine with which memory command the error corresponded. For example, the error signals are output via a common output (e.g., common output pin of the memory device 110 of FIG. 1), the timing of when the error signal 251 is output is used to determine the type of error. For example at timing T9, errors related to the CRC write check circuitry 218, and associated with WRCRC2ERR, are reported via the error signal 251. The host device 120 receives the error signal 251, and, based on the timing, determines the type of error. For example at time T9, the host device 120 determines that the error signal 251 is reported by the CRC write check circuitry 218 and corresponds to an error detected by the CRC write check circuitry 218. At time T11, the host device 120 determines that the error signal 251 includes an error detected by the DPCRC check circuitry 226.

In one example, the host device 120 receives the error signal 251 at timing T11. Based on receiving the error signal at time T11, the host device 120 retries the first and second memory commands as the host device 120 is unable to determine if the error was detected by the DPCRC check circuitry 226 and is associated with the memory command m (e.g., the first write memory command), if the error was detected by the CRC write check circuitry 218 and is associated with the memory command n (e.g., the second write memory command), or a parity check error associated with the memory command m or the memory command n.

In one example, a method includes receiving a first error signal from a memory device, comparing the first error signal to timing data associated with write data path circuitry of the memory device. Further, the method includes determining that a first error signal comprises a first error detected by cyclic redundancy check (CRC) circuitry within the write data path circuitry.

In one example, a method includes receiving a first signal from read data path circuitry of a memory device, and generating first cyclic redundancy check (CRC) codes from the first signal. Further, the method includes determining an error within the first signal based on the first CRC codes. The error is associated with an output of detected by data path CRC (DPCRC) check circuitry within the read data path circuitry.

Figure 5A:
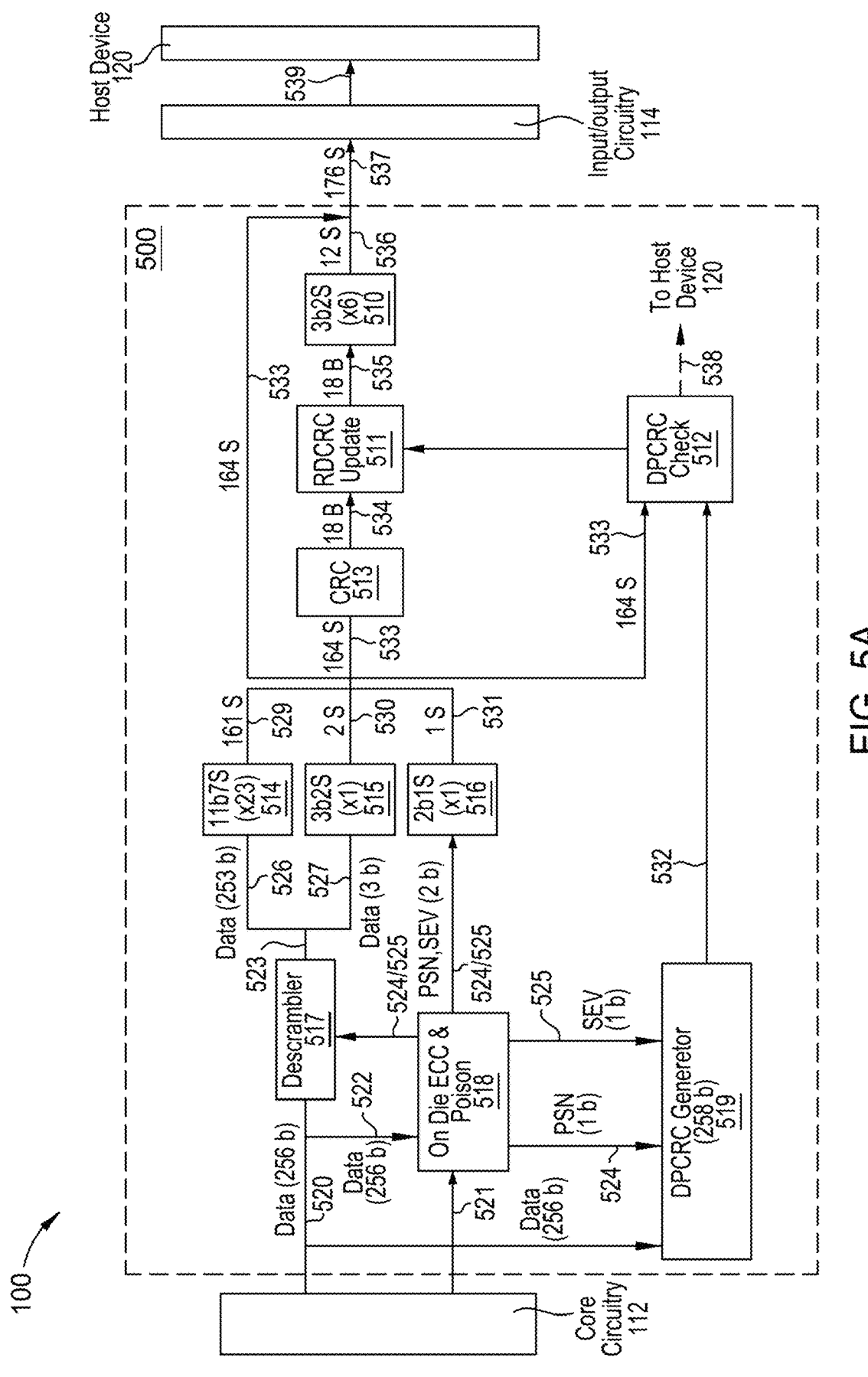
FIG. 5A is a block diagram of read data path circuitry of a memory system.

FIG. 5A illustrates an example block diagram of read data path circuitry 500 of the memory system 100 of FIG. 1. The read data path circuitry 500 is part of the data path circuitry 116 of FIG. 1. The read data path circuitry 500 is included within the memory device 110. The read data path circuitry 500 may be included within a common IC device and/or die as the core circuitry 112 and/or the input/output circuitry 114. The read data path circuitry 500 communicates a data signal received from the core circuitry 112 to the input/output circuitry 114 and the host device 120 (e.g., the memory controller circuitry 122 of the host device 120) based on a read command issued by the host device 120.

The read data path circuitry 500 includes encoder circuitries 510, 514, 515, and 516, read CRC (RDCRC) update circuitry 511, DPCRC check circuitry 512, CRC read check circuitry 513, descrambler circuitry 517, on die ECC circuitry 518, and DPCRC generator circuitry 519. In one example, the DPCRC check circuitry 512 and the DPCRC generator circuitry 519 form data path CRC circuitry (e.g., the data path CRC circuitry 118 of FIG. 1).

The output of the core circuitry 112 is coupled to inputs of the DPCRC generator circuitry, the descrambler circuitry 517, and the on die ECC circuitry 518. The output(s) of the descrambler circuitry 517 is coupled to the inputs of the encoder circuitry 514 and the encoder circuitry 515. Further, an output of the descrambler circuitry 517 is coupled to an input of the on die ECC circuitry 518, and an output of the on die ECC circuitry 518 is coupled to the descrambler circuitry 517. Outputs of the on die ECC circuitry 518 are coupled to inputs of the DPCRC generator circuitry 519. An output of the DPCRC generator circuitry 519 is coupled to the DPCRC check circuitry 512. Outputs of the encoder circuitries 514, 515 and 516 are coupled to inputs of the CRC check circuitry, the DPCRC check circuitry, and the output of the encoder circuitry 510. An output of the CRC read check circuitry 513 is coupled to an input of the RDCRC update circuitry 511. An output of the DPCRC check circuitry 512 is coupled to an input of the RDCRC update circuitry 511. An output of the RDCRC update circuitry 511 is coupled an input of the encoder circuitry 510. The output of the encoder circuitry 510 is coupled to an input of the input/output circuitry 114. An output of the input/output circuitry 114 is coupled to an input of the host device 120.

The core circuitry 112 outputs the data signal 520 to the descrambler circuitry 517, the on die ECC circuitry 518, and the DPCRC generator circuitry 519, and the ECC codes of the signal 521 to the on die ECC circuitry 518 based on receiving a read command from the host device 120.

The data signal 520 corresponds to a read command received from the host device 120. For example, the read command indicates an address that is to be read from in the core circuitry 112, and the core circuitry 112 outputs the corresponding data as the data signal 520 and ECC codes via the signal 521.

The descrambler circuitry 517 generates the signal 523 by from the data signal 520 and the poison bit 524 received from the on die ECC circuitry 518. In one example, the output descrambler circuitry 517 descrambles the data signal 520 to generate the signal 523. The signal 523 is split into signals 526 and 527. The signal 526 has more bits of the signal 523 than the signal 527. In an example where the signal 523 has 256 bits, the signal 526 has 253 bits and the signal 527 has three bits.

The encoder circuitry 514 receives the signal 526 and encodes the data of the signal 526 to generate the signal 529. The signal 529 includes symbols. The encoder circuitry 514 generates symbols from the data bits of the signal 526. In an example where the signal has 253 bits, the signal 529 has 161 symbols.

The encoder circuitry 515 receives the signal 527 and encodes the data of the signal 527 to generate the signal 530. The signal 530 includes symbols. The encoder circuitry 515 generates symbols from the data bits of the signal 527. In an example where the signal has three bits, the signal 530 has two symbols.

The on die ECC circuitry 518 receives the signals 520 and 521 and generates the poison bit 524. The signal 521 includes one or more ECC codes. The on die ECC circuitry 518 generates the poison bit 524 and the severity bit 525 from the data signal 520 and the ECC codes of the signal 521.

In one example, the on die ECC circuitry 518 detects errors within the data signal 520 based on the ECC codes of the signal 521. If an error is detected, the on die ECC circuitry 518 may request a re-transmittal of the data signal from the core circuitry 112 and/or the on die ECC circuitry 518 corrects the error based on the ECC codes. In another example, the on die ECC circuitry 518 does not correct a detected error. In one or more examples, the on die ECC circuitry 518 generates the severity bit 525 based on whether or not an error was detected in the data signal 520. For example, the severity bit 525 has a value of zero (or one) when an error is detected in the data signal 520, and the severity bit has a value of one (or zero) when an error is detected in the data signal 520. In other examples, other values may be used to indicate whether or not an error was detected.

The encoder circuitry 516 receives the poison bit 524 and the severity bit 525 from the on die ECC circuitry 518, and generates the signal 531 from the poison bit 524 and severity bit 525. The signal 531 has one symbol. The signals 529, 530, and 531 are combined into the signal 533. The number of symbols within the signal 533 corresponds to the combined number of symbols within the signals 529, 530, and 531. The signal 533 is received by the CRC read check circuitry 513, the DPCRC check circuitry 512, and to the output of the encoder circuitry 510.

The DPRC generator circuitry 519 receives the data signal 520 from the core circuitry 112. The DPCRC generator circuitry 519 further receives the poison bit 524 from the on die ECC circuitry 518, and the severity bit 525 from the on die ECC circuitry 118. Accordingly, in such an example, the DPCRC generator circuitry 519 receives the bits associated with the data signal 520 and the poison and read bits 524, 525 associated with the read command. The DPCRC generator circuitry 519 receives each of the data bits that are propagated through the read data path circuitry 500 to generate the output signal 537.

The DPCRC generator circuitry 519 generates the error check signal 532 based on the data signal 520, the poison bit 524, and the severity bit 525. In one example, the error check signal 532 is a parity bit(s) and is generated based on the number of ones or zeros within the data signal 520, the poison bit 524, and the severity bit 525. For example if the number of ones is odd, the parity bit has a value of one (or zero). Further, if the number of ones is even, the parity bit has a value of zero (or one). In another example, the error check signal 532 is an CRC code(s) and is generated from the signals and bits 520, 524, and 525.

The DPCRC check circuitry 512 receives the signal 533 and the error check signal 532. The DPCRC check circuitry 512 generates an error check signal from the signal 533 and compares the generated error check signal with the parity bit of the signal 533 received from the DPCRC generator circuitry 519. If the error check signals match (e.g., have the same value), then no error in the signal 533 is determined. If the error check signals are different from each other (e.g., have different values), than an error in the signal 533 is determined. The error check signal generated by the DPCRC check circuitry 512 may be a parity bit(s) or a CRC code(s). The error check signal generated by the DPCRC check circuitry 512 corresponds to the error check signal 532. For example, if the error check signal 532 includes a parity bit, the error check signal generated by the DPCRC check circuitry 512 includes a parity bit. Further, if the error check signal 532 includes a CRC code, the error check signal generated by the DPCRC check circuitry 512 includes a CRC code.

An error in the signal 533 corresponds to a difference between the signal 533 and the signal 520, the poison bit 524 and the severity bit 525. For example, an error indicates that a value of the signal 533 differs from the value of the signal 520, the poison bit 524, and the severity bit 525. The error occurs between the output of the on die ECC circuitry 518 and the input of the CRC read check circuitry 513.

In one example, the DPCRC check circuitry 512 outputs an error signal 538 to the host device 120 indicating that an error has occurred. The error signal 538 may be a single bit (or more) signal. A value of zero (or one) indicates an error was detected, and a value of one (or zero) indicates no errors detected. In other examples, other values may be used to indicate the detection of no error or an error. Based on an indication of an error occurring, the read command may be repeated. For example, the core circuitry 112 may be instructed to retransmit the signal 520 and the signal 521. In another example, the error signal 538 is output to the RDCRC update circuitry 511.

The CRC read check circuitry 513 is connected to the outputs of the encoder circuitries 514-516. The output of the CRC read check circuitry 513 is coupled to an input of the RDCRC update circuitry 511. Further, the output of the DPCRC check circuitry 512 is connected to an input of the RDCRC update circuitry 511. In one or more examples, the RDCRC update circuitry 511 is optional. In such an example, the output of the DPCRC check circuitry 512 is output to the input/output circuitry 114 and to the host device 120. Further, in such an example, the output of the CRC read check circuitry 513 is coupled to the encoder circuitry 510. In an example where the RDCRC update circuitry 511 is included, the RDCRC update circuitry 511 is coupled to the output of the CRC read check circuitry 513, and the output of the DPCRC check circuitry 512.

The CRC read check circuitry 513 generates the signal 534 from the signal 533. The signal 534 includes CRC code (e.g., CRC data) having one or more bits. In one example, the signal 533 has 164 symbols, and the signal 534 has 18 bits of CRC data. The signal 534 is output by the CRC read check circuitry 513.

The RDCRC update circuitry 511 receives the signal 534 from the CRC read check circuitry 513. Further, the RDCRC update circuitry 511 receives the error signal 538 from the DPCRC check circuitry 512. The RDCRC update circuitry 511 updates the signal 534 based on the value of the error signal 538 (e.g., whether or not an error is indicated by the error signal 538). For example, based on the error signal 538 being indicative of an error (e.g., having a value of one or zero), the RDCRC update circuitry 511 updates (e.g., changes) one or more bit values within the signal 534. Further, based on the error signal 538 not being indicative of an error (e.g., having a value of zero or one), the RDCRC update circuitry 511 does not update (e.g., does not change) one or more bits values of the signal 534. Changing a bit value includes changing a bit value from a zero to one or from a one to zero.

The signal 535 output by the RDCRC update circuitry 511 is received by the encoder circuitry 510. The encoder circuitry 510 generates the signal 536 from the signal 535. The encoder circuitry 510 encodes the bits within the signal 535 into symbols to generate the signal 535.

The signal 535 is combined with the signal 533 to generate the signal 537, which is output to the input/output circuitry 114 and output to the host device 120. To detect errors within the received signal 539, the host device 120 (e.g., the memory controller circuitry 122) generates a CRC code from the signal 539. If the signal 534 is updated to indicate that an error was detected by the DPCRC check circuitry 512, the signal 537 (or 538) differs from the signal 533 and the signal 534. Accordingly, the CRC code generated by the host from the signal 539 differs from the CRC code of the signal 534 generated from the signal 533. The host device 120 determines that an error is present within the signal 539 as the CRC code generated from the signal 539 differs from the CRC code of the signal 534 generated from the signal 533. In one example, the host device 120 performs error checking by generating a CRC code from the signal 539. Based on the CRC code not matching the expected CRC code (e.g., the CRC code of signal 534), an error is indicated by the host device 120.

The signal 539 is output as a PAM-3 signal. In other examples, the signal 539 may have more or less than three levels, or a different communication protocol than pulse-amplitude modulation.

Figure 5B:
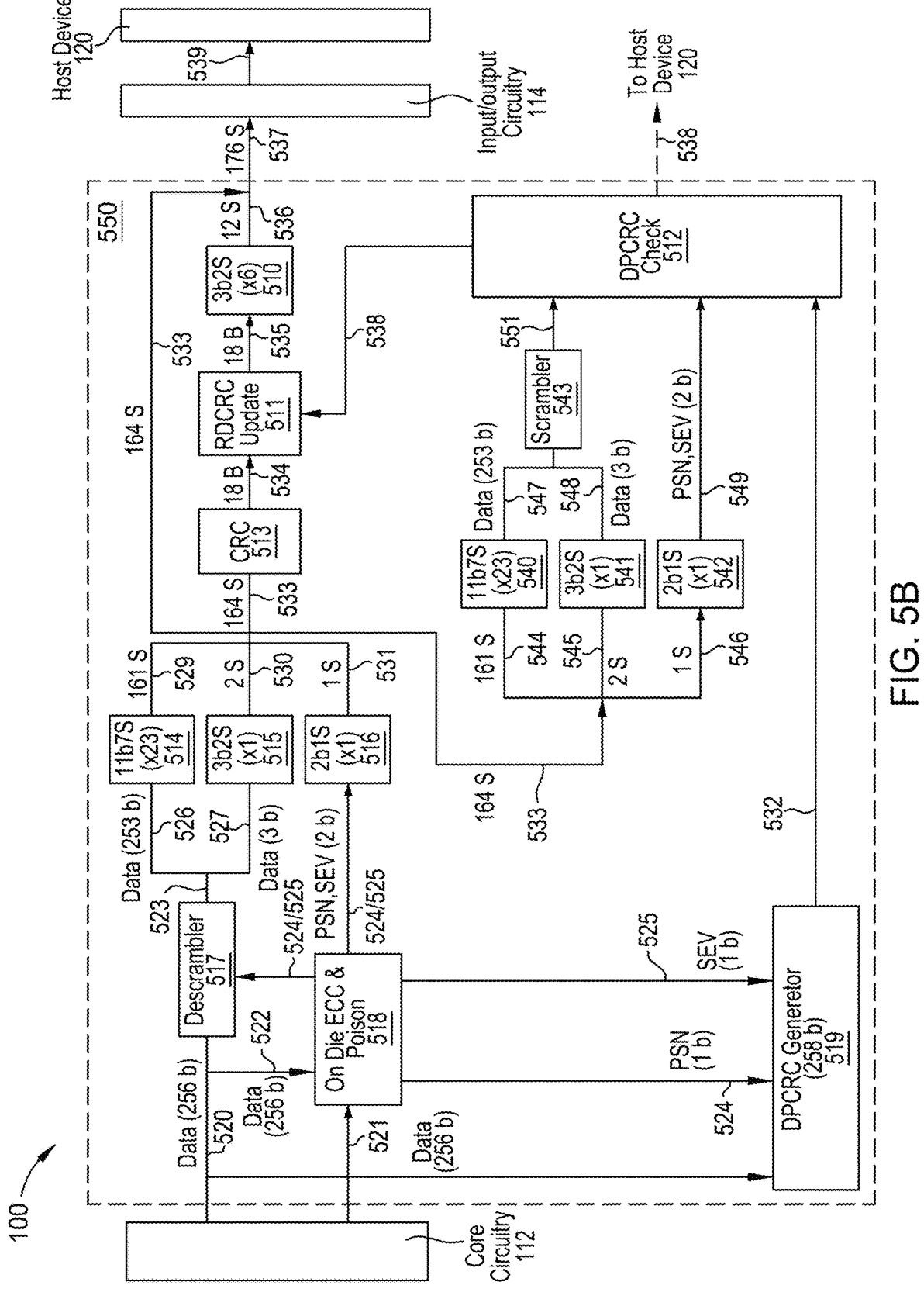
FIG. 5B is a block diagram of read data path circuitry of a memory system.

FIG. 5B illustrates an example block diagram of read data path circuitry 550 of the memory system 100 of FIG. 1. The read data path circuitry 550 is part of the data path circuitry 116 of FIG. 1. The read data path circuitry 550 is included within the memory device 110. The read data path circuitry 550 may be included within a common IC device and/or die as the core circuitry 112 and/or the input/output circuitry 114. The read data path circuitry 550 communicates a data signal received from the core circuitry 112 to the input/output circuitry 114 and the host device 120 (e.g., the memory controller circuitry 122 of the host device 120) based on a read command issued by the host device 120.

The read data path circuitry 550 is configured similar to that of the read data path circuitry 500 of FIG. 5A. For example, the read data path circuitry 550 includes encoder circuitries 510, 514, 515, and 516, read CRC (RDCRC) update circuitry 511, DPCRC check circuitry 512, CRC read check circuitry 513, descrambler circuitry 517, on die ECC circuitry 518, and DPCRC generator circuitry 519. As compared to the read data path circuitry 500 of FIG. 5A, the read data path circuitry 550 further includes decoder circuitries 540-542, and scrambler circuitry 543. Further, the inputs of the decoder circuitries 540-542 are coupled to the outputs of the encoder circuitries 514-516. The input of the scrambler circuitry 543 is coupled to the outputs of the decoder circuitries 540-541, and the inputs of the DPCRC check circuitry 512 are coupled to the output of the scrambler circuitry 543 and the decoder circuitry 542. In one or more examples, the DPCRC check circuitry 512 and the DPCRC generator circuitry 519 for data path CRC circuitry (e.g., the data path CRC circuitry 118 of FIG. 1).

The decoder circuitry 540 receives a signal 544 including a first portion of the symbols of the signal 533 and decodes the symbols of the signal 544 to generate the signal 547 comprising one or more bits. The decoder circuitry 541 receives a signal 545 including a second portion of the symbols of the signal 533 and decodes the symbols of the signal 545 to generate the signal 548 comprising one or more bits. The decoder circuitry 542 receives a signal 546 including a third portion of the symbols of the signal 533 and decodes the symbols of the signal 546 to generate the signal 549 comprising one or more bits. In one example, the number of symbols in the signal 544 is greater than that of the signal 545, and the number of the symbols in the signal 545 is greater than that of the signal 546. Further, the number of bits in the signal 547 is greater than that of the signal 548, which is greater than that of the signal 549. In one example, the signal 544 includes 161 symbols, the signal 545 includes 2 symbols, and the signal 546 includes one symbol. Further, the signal 547 includes 253 bits, the signal 548 includes 3 bits, and the signal 549 includes two bits. The signal 549 includes a poison bit and a severity bit.

The signals 547 and 548 are received by the scrambler circuitry 543, which scrambles the bits of the signals 547 and 548 to generate the signal 551. In one example, the signals 547 and 548 are combined before or after being received by the scrambler circuitry 543. The signal 551 is received by the DPCRC check circuitry 512.

The DPCRC check circuitry 512 further receives the signal 549 and the error check signal 532. The DPCRC check circuitry 512 generates an error check signal from the signals 551 and 549, which is compared to the error check signal 532 to determine if errors are present within the corresponding data signal of the read data path circuitry 550. In one example, the DPCRC check circuitry 512 generates an error check signal having one or more parity bits. In another example, the DPCRC check circuitry 512 generates an error check signal having one or more CRC codes. As is described above, the DPCRC check circuitry 512 outputs the error signal 538 to the host device 120 (e.g., via the input/output circuitry 114) and/or outputs the error signal 538 to the RDCRC update circuitry 511.

Figure 6:
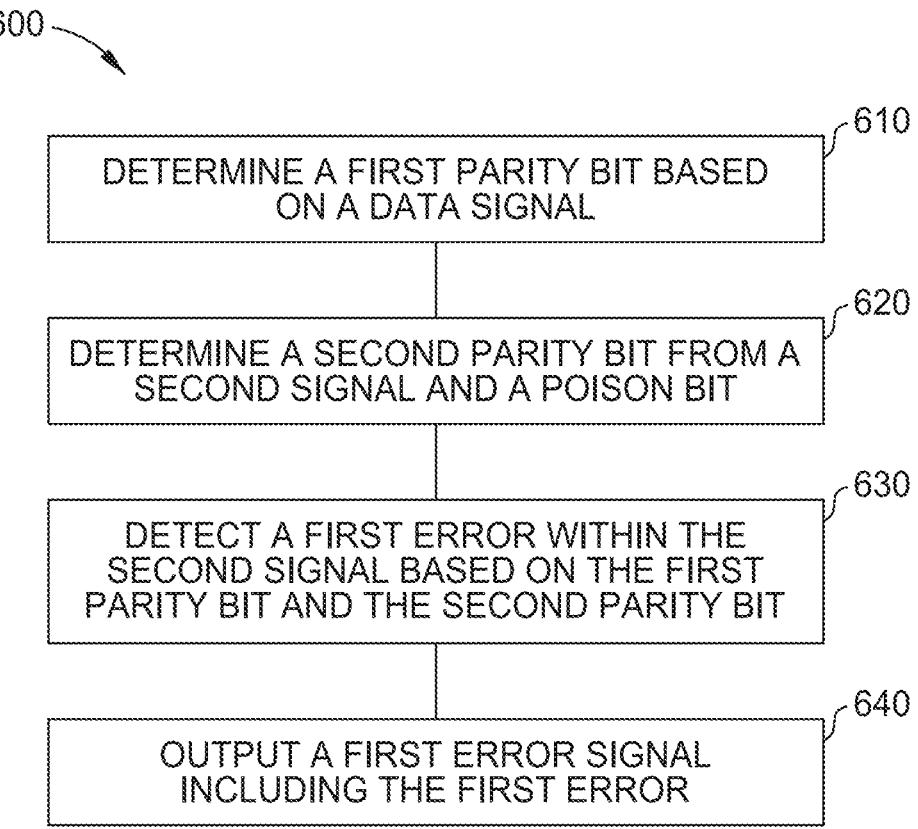
FIG. 6 illustrates a flowchart of a method for detecting errors within data path circuitry.

FIG. 6 illustrates a flowchart of a method 600 for determining an error within data path circuitry, according to one or more examples. In one example, the method 600 is performed by the write data path circuitry 200 of FIG. 2A or the write data path circuitry 270 of FIG. 2B.

At 610 of the method 600, a first parity bit is determined based on the data signal. In one example, DPCRC generator circuitry (e.g., the DPCRC generator circuitry 224 of FIG. 2A or FIG. 2B) determines the error check signal 236 (e.g., a parity bit) based on the signal 231 as is described above with regard to FIG. 2A and/or FIG. 2B. In one example, 610 of the method 600 is optional. For example, 610 of the method may be omitted from the method 600. In such an example, the first parity bit is determined external to the DPCRC generator circuitry. For example, the first parity bit may be received from a host device (e.g., the host device 120) or another device or circuit element external to the DPCRC generator circuitry. The first parity bit may be received as part of a data signal or another signal provided to the data path circuitry (e.g., provided by a host device or another device or circuit element external to the DPCRC generator circuitry).

At 620 of the method 600, a second parity bit is determined from a second signal and a poison bit. In one example, the DPCRC check circuitry (e.g., the DPCRC check circuitry 226 of FIG. 2A or FIG. 2B) determines a parity bit or bits based on the poison bit 244 and the signal 243 as is described above with regard to FIG. 2A and/or FIG. 2B.

At 630 of the method 600, a first error is detected within the second signal based on the first parity bit and the second parity bit. In one example, the DPCRC check circuitry (e.g., the DPCRC check circuitry 226 of FIG. 2A or FIG. 2B) detects an error based on the parity bits as is described above with regard to FIG. 2A and/or FIG. 2B.

At 640 of the method 600, a first error signal including the first error is output. In one example, write path data circuitry (e.g., the write data path circuitry 200 of FIG. 2A or the write data path circuitry 270 of FIG. 2B) outputs the error signal 251 as is described above with regard to FIG. 2A and/or FIG. 2B.

Figure 7:
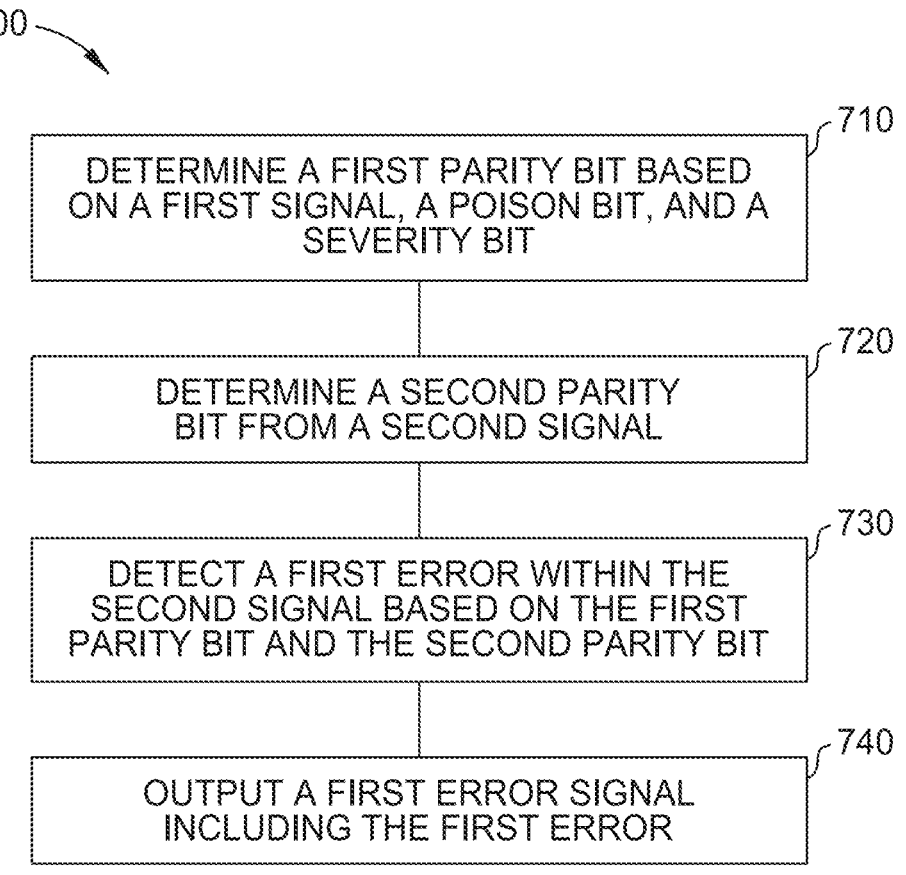
FIG. 7 illustrates a flowchart of a method for detecting errors within data path circuitry.

FIG. 7 illustrates a flowchart of a method 700 for determining an error within data path circuitry, according to one or more examples. In one example, the method 700 is performed by the read data path circuitry 500 of FIG. 5A or the write data path circuitry 570 of FIG. 5B.

At 710 of the method 700, a first parity bit is determined based on a first signal, a poison bit, and a severity bit. In one example, DPCRC generator circuitry (e.g., the DPCRC generator circuitry 519 of FIG. 5A or FIG. 5B) determines the error check signal 532 (e.g., a parity bit or bits) based on the signal 520, the poison bit 524, and the severity bit 525 as is described above with regard to FIG. 5A and/or FIG. 5B. In one example, at least a portion of 710 of the method 700 is optional and may be omitted from the method 700. For example, the first parity bit may be determined external to the data path circuitry and provided to the data path circuitry. In one example, the first parity bit is determined external to the DPCRC generator circuitry. For example, the first parity bit may be received from a host device (e.g., the host device 120), the core circuitry, or another device or circuit element external to the DPCRC generator circuitry. The first parity bit may be received as part of a data signal or another signal provided to the data path circuitry (e.g., provided by a host device, core circuitry, or another device or circuit element external to the DPCRC generator circuitry).

At 720 of the method 700, a second parity bit is determined from a second signal. In one example, the DPCRC check circuitry (e.g., the DPCRC check circuitry 512 of FIG. 5A or FIG. 5B) determines a parity bit or bits based on the signal 533 as is described above with regard to FIG. 5A and/or FIG. 5B.

At 730 of the method 700, a first error is detected within the second signal based on the first parity bit and the second parity bit. In one example, the DPCRC check circuitry (e.g., the DPCRC check circuitry 512 of FIG. 5A or FIG. 5B) detects an error based on the parity bits as is described above with regard to FIG. 5A and/or FIG. 5B.

At 740 of the method 700, a first error signal including the first error is output. In one example, read path data circuitry (e.g., the read data path circuitry 500 of FIG. 5A or the read data path circuitry 550 of FIG. 5B) outputs the error signal 538 as is described above with regard to FIG. 5A and/or FIG. 5B.

While the foregoing is directed to specific examples, other and further examples may be devised without departing from the basic scope thereof, and the scope thereof is determined by the claims that follow.

What is claimed is:

1. A memory device comprising:
input/output circuitry configured to be coupled to a host device;
core circuitry comprising memory cells; and
write data path circuitry coupled between the input/output circuitry and the core circuitry and configured to:
receive an input signal from the host device via the input/output circuitry, the input signal associated with a write command and comprising data symbols and cyclic redundancy check (CRC) symbols;
perform a cyclic redundancy check on the input signal based on the CRC symbols;
determine a second parity bit from a second signal and a poison bit, wherein the second signal and the poison bit are determined by processing a first signal comprising the data symbols;
detect a first error within the second signal based on a first parity bit and the second parity bit; and
output a first error signal comprising the first error.

2. The memory device of claim 1, wherein the data path circuitry is further configured to determine the first parity bit based on the first signal.

3. The memory device of claim 1, wherein performing the cyclic redundancy check comprises:
detect a second error within the first signal based on a comparison of the first signal with CRC codes generated from the CRC symbols; and
output a second error signal comprising the second error.

4. The memory device of claim 3, wherein the write data path circuitry is further configured to combine the first error signal with the second error signal to generate an output error signal, wherein the output error signal is output to a host device.

5. The memory device of claim 4, wherein the host device is configured to:
receive an output error signal comprising the first error signal; and
determine, based on timing information associated with write data path, that the output error signal includes the first error signal.

6. The memory device of claim 1, wherein the write data path circuitry comprises:
first decoder circuitry configured to generate CRC values from the CRC symbols, wherein the data symbols are associated with data to be written to the core circuitry.

7. The memory device of claim 6 wherein the write data path circuitry further comprises:
CRC write check circuitry configured detect a third error within the input signal based on the data symbols with the CRC values; and
data path CRC (DPCRC) generator circuitry configured to receive the first signal comprising the data symbols of the input signal and determine the first parity bit from the data symbols.

8. The memory device of claim 7, wherein the write data path circuitry further comprises:
decoder circuitry configured to generate data signals and the poison bit from the data symbols;
scrambler circuitry configured to generate the second signal based on the data symbols; and on die error correction code (ECC) circuitry configured to detect a fourth error within the second signal based on the poison bit.

9. The memory device of claim 8, wherein the write data path circuitry further comprises:
   DPCRC check circuitry configured to:
      receive the second signal from the scrambler circuitry, the poison bit, and a severity bit;
      determine the second parity bit from the second signal, the poison bit, and the severity bit; and
      output the first error signal to the host device.

10. The memory device of claim 9, wherein the write data path circuitry further comprises:
   descrambler circuitry and encoder circuitry configured to receive the second signal from the descrambler circuitry, the poison bit, and the severity bit, and determine a third signal and a fourth signal; and
   DPCRC check circuitry configured to:
      receive the third signal and the fourth signal from the descrambler circuitry and encoder circuitry;
      determine the second parity bit from the third signal and the fourth signal; and
      output the first error signal to the host device.

11. A memory device comprising:
   input/output circuitry configured to be coupled to a host device;
   core circuitry comprising memory cells; and
   read data path circuitry coupled between the input/output circuitry and the core circuitry and configured to:
      receive a first signal and a second signal from core circuitry, the first signal associated with a read command and comprising data symbols and the second signal comprising error codes;
      determine a first parity bit based on the first signal, a poison bit, and a severity bit, wherein the poison bit and the severity bit are determined from the data symbols of first signal and the error codes of the second signal;
      detect a first error within a third signal based on the first parity bit and a second parity bit, wherein the third signal is generated by processing the first signal; and
      output a first error signal comprising the first error.

12. The memory device of claim 11, wherein the read data path circuitry is further configured to determine the second parity bit from the third signal.

13. The memory device of claim 11, wherein the read data path circuitry is further configured to:
   generate cyclic redundancy check (CRC) codes based on the third signal; and
   update the CRC codes based on the first error signal.

14. The memory device of claim 13, wherein the read data path circuitry is further configured to output the first error signal to the host device.

15. The memory device of claim 11, wherein the read data path circuitry comprises:
   descrambler circuitry configured to generate a fourth signal from the first signal;
   first and second encoder circuitries configured to generate first and second symbol signals from the fourth signal;
   error correction code (ECC) circuitry configured to determine the severity bit;
   third encoder circuitries configured to generate a third symbol signal from the poison bit and the severity bit, wherein the first, second, and third symbol signals are combined into the third signal; and
   CRC circuitry configured to generate CRC codes from the third symbol signal.

16. The memory device of claim 15, wherein the read data path circuitry further comprises:
   data path CRC (DPCRC) generator circuitry configured to receive the first signal, the poison bit, and the severity bit, and determine the first parity bit based on the first signal, the poison bit, and the severity bit; and
   DPCRC check circuitry configured to:
      receive the first parity bit and the third signal;
      determine the second parity bit from the third signal;
      detect the first error within the third signal based on the comparison between the first parity bit and the second parity bit; and
      output the first error signal.

17. The memory device of claim 16, wherein the read data path circuitry further comprises:
   read (CRC) update circuitry configured to receive the CRC codes and the first error signal and update a value of the CRC codes based on the first error signal, and wherein the read data path circuitry is further configured to output an output signal to a host device, the output signal comprises the updated CRC codes, wherein the host device is configured to detect an error within the output signal based on CRC codes generated from the output signal.

18. The memory device of claim 14, wherein the read data path circuitry further comprises:
   decoder circuitries and scrambler circuitries configured to receive the first signal, the poison bit and the severity bit, and generate a fourth signal and a fifth signal; and
   data path CRC (DPCRC) generator circuitry configured to receive the fourth signal and the fifth signal, and determine the first parity bit based on the fourth signal and the fifth signal; and
   DPCRC check circuitry configured to:
      receive the first parity bit and the second signal;
      determine the second parity bit from the second signal;
      detect the first error within the second signal based on the comparison between the first parity bit and the second parity bit; and
      output the first error signal.

19. A memory system comprising:
   a host device comprising memory controller circuitry; and
   a memory device coupled to the host device, the memory device comprising:
   input/output circuitry configured to be coupled to a host device;
   core circuitry comprising memory cells; and
   write data path circuitry coupled between the input/output circuitry and the core circuitry and configured to:
      receive an input signal from the memory controller circuitry avia the input/output circuitry, the input signal associated with a write command and comprising data symbols and cyclic redundancy check (CRC) symbols;
      perform a cyclic redundancy check on the input signal based on the CRC symbols;
      determine a second parity bit from a second signal and a first poison bit, wherein the second signal and the first poison bit are determined by processing a first signal comprising the data symbols;
      detect a first error within a second signal based on a first parity bit and the second parity bit; and
      output a first error signal comprising the first error to the host device.

20. The memory system of claim 19, wherein the memory device further comprises:

read data path circuitry coupled to the core circuitry and
   configured to:
     determine a third parity bit based on a fifth signal, a
       second poison bit, and a second severity bit, wherein
       the second poison bit and the second severity bit are
       determined from a fourth signal;
     detect a second error within the fifth signal based on the
       third parity bit and a fourth parity bit; and
     output a second error signal comprising the second
       error to the host device.

* * * * *